(12) United States Patent
Booth, Jr. et al.

(10) Patent No.: US 7,656,005 B2
(45) Date of Patent: *Feb. 2, 2010

(54) ELECTRICALLY PROGRAMMABLE π-SHAPED FUSE STRUCTURES AND METHODS OF FABRICATION THEREOF

(75) Inventors: Roger A. Booth, Jr., Rochester, MN (US); Kangguo Cheng, Beacon, NY (US); Jack A. Mandelman, Flat Rock, NC (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/768,254

(22) Filed: Jun. 26, 2007

(65) Prior Publication Data

US 2007/0247273 A1   Oct. 25, 2007

Related U.S. Application Data

(63) Continuation of application No. 11/372,380, filed on Mar. 9, 2006, now Pat. No. 7,288,804.

(51) Int. Cl.
*H01L 29/00* (2006.01)
(52) U.S. Cl. .................. 257/529; 257/209; 257/665; 438/132; 438/601; 438/618
(58) Field of Classification Search ............. 257/529, 257/209, 665; 438/601, 132, 618
See application file for complete search history.

(56) References Cited

U.S. PATENT DOCUMENTS

| | | | |
|---|---|---|---|
| 4,198,744 A * | 4/1980 | Nicolay | ............... 438/601 |
| 4,382,289 A | 5/1983 | Saitoh | |
| 4,517,583 A | 5/1985 | Uchida | |
| 4,536,948 A | 8/1985 | Te Velde et al. | |
| 4,630,355 A | 12/1986 | Johnson | |
| 4,670,970 A | 6/1987 | Bajor | |
| 4,747,076 A | 5/1988 | Mukai | |

(Continued)

FOREIGN PATENT DOCUMENTS

JP          60231350 A       11/1985

(Continued)

*Primary Examiner*—David Vu
*Assistant Examiner*—Brandon Fox
(74) *Attorney, Agent, or Firm*—Heslin Rothenberg Farley & Mesiti, PC

(57) ABSTRACT

Electrically programmable fuse structures for an integrated circuit and methods of fabrication thereof are presented, wherein the electrically programmable fuse has a first terminal portion and a second terminal portion interconnected by a fuse element. The first terminal portion and the second terminal portion reside over a first support and a second support, respectively, with the first support and the second support being spaced apart, and the fuse element bridging the distance between the first terminal portion over the first support and the second terminal portion over the second support. The fuse, first support and second support define a π-shaped structure in elevational cross-section through the fuse element. The first terminal portion, second terminal portion and fuse element are coplanar, with the fuse element residing above a void, which in one embodiment is filed by a thermally insulating dielectric material that surrounds the fuse element.

7 Claims, 10 Drawing Sheets

U.S. PATENT DOCUMENTS

| | | | |
|---|---|---|---|
| 4,949,063 A | 8/1990 | Levko | |
| 5,019,532 A | 5/1991 | Kaya | |
| 5,420,456 A | 5/1995 | Galbi et al. | |
| 5,572,409 A | 11/1996 | Nathan et al. | |
| 5,618,750 A | 4/1997 | Fukuhara et al. | |
| 5,976,943 A * | 11/1999 | Manley et al. | 438/382 |
| 6,337,507 B1 * | 1/2002 | Bohr et al. | 257/529 |
| 6,420,456 B1 * | 7/2002 | Koski | 523/213 |
| 6,512,284 B2 | 1/2003 | Schulte et al. | |
| 6,642,601 B2 * | 11/2003 | Marshall et al. | 257/529 |
| 6,661,330 B1 | 12/2003 | Young | |
| 6,703,680 B2 * | 3/2004 | Toyoshima | 257/529 |
| 6,756,255 B1 * | 6/2004 | Thuruthiyil et al. | 438/132 |
| 6,879,018 B2 | 4/2005 | Marr et al. | |
| 6,960,978 B2 | 11/2005 | Leigh et al. | |
| 7,288,804 B2 | 10/2007 | Booth, Jr. et al. | |
| 2003/0209734 A1 | 11/2003 | Kothandaraman | |
| 2004/0209404 A1 | 10/2004 | Wang et al. | |
| 2005/0219932 A1 | 10/2005 | Diorio et al. | |
| 2005/0285224 A1 * | 12/2005 | Tsutsui | 257/531 |
| 2006/0118904 A1 * | 6/2006 | Liaw | 257/529 |
| 2007/0247273 A1 | 10/2007 | Booth, Jr. et al. | |

FOREIGN PATENT DOCUMENTS

| | | |
|---|---|---|
| JP | 63246844 A | 10/1988 |
| JP | 05120985 A | 5/1993 |

\* cited by examiner

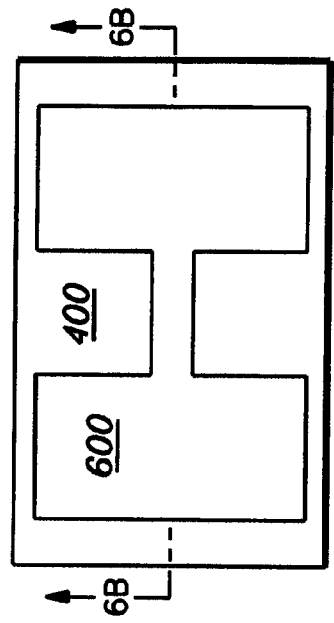
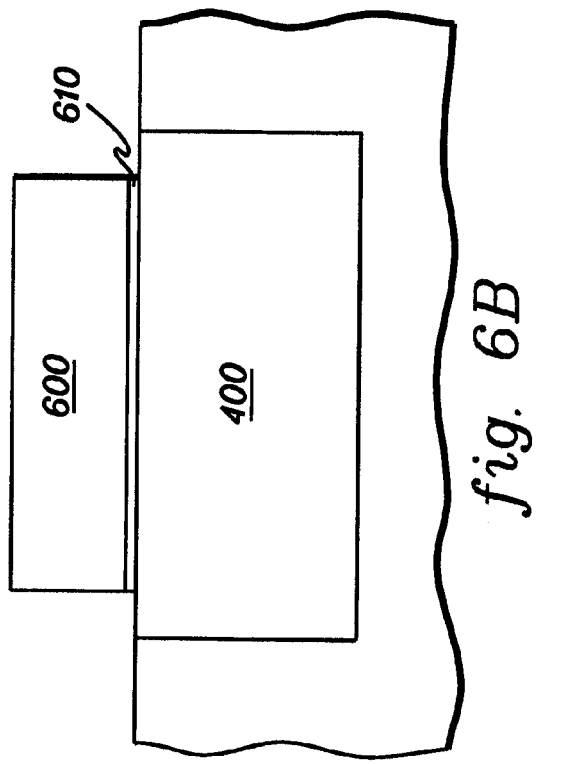
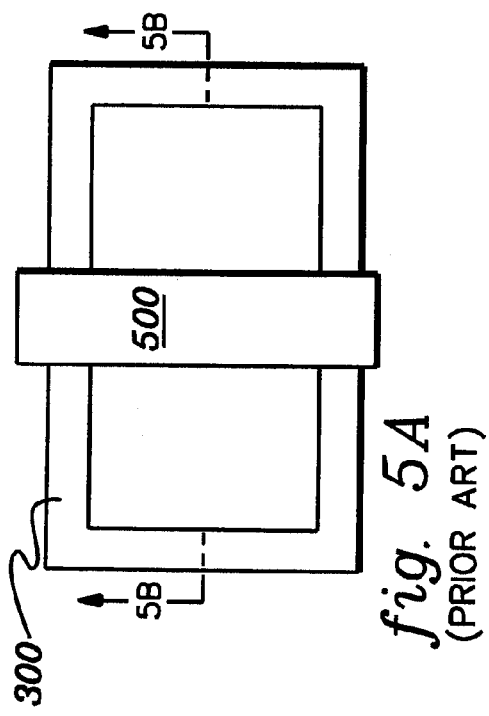
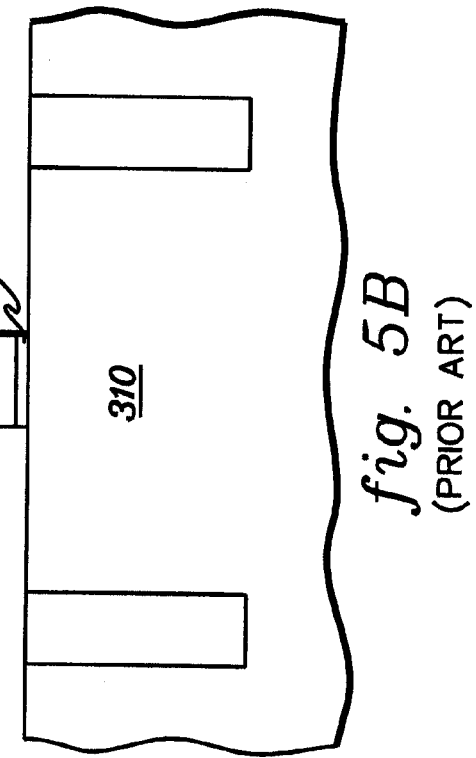

ELECTRICALLY PROGRAMMABLE π-SHAPED FUSE STRUCTURES AND METHODS OF FABRICATION THEREOF

CROSS-REFERENCE TO RELATED APPLICATIONS

This application is a continuation of co-pending U.S. patent application Ser. No. 11/372,380, filed Mar. 9, 2006, entitled "Electrically Programmable π-Shaped Fuse Structures and Methods of Fabrication Thereof", by Booth et al., the entirety of which is hereby incorporated herein by reference. Additionally, this application contains subject matter which is related to the subject matter of the following commonly assigned applications, each of which is also hereby incorporated herein by reference in its entirety:

"Electrically Programmable Fuse Structures with Terminal Portions Residing at Different Heights, and Methods of Fabrication Thereof", by Hovis et al., U.S. Ser. No. 11/372,334, filed Mar. 9, 2006;

"Electronic Fuse with Conformal Fuse Element Formed Over a Freestanding Dielectric Spacer", by Hsu et al., U.S. Ser. No. 11/372,387, filed Mar. 9, 2006; and "Electrically Programmable Fuse Structures with Narrowed Width Regions Configured to Enhance Current Crowding and Methods of Fabrication Thereof", by Booth et al., U.S. Ser. No. 11/372,386, filed Mar. 9, 2006.

TECHNICAL FIELD

The present invention relates in general to semiconductor structures and methods of fabrication thereof, and more particularly, to fuses and methods of fabrication thereof, which employ a fuse element that is electrically programmable utilizing today's integrated circuit operating voltages.

BACKGROUND OF THE INVENTION

Historically, repair of dynamic random access memory (DRAM) arrays is achieved by replacing defective word-lines or bit-lines with redundant word-lines or bit-lines, using a laser to open circuit fuses made of a conductive material. As devices continue to shrink, the relative size of these laser fuses is limited by the wavelength of the laser employed. Therefore, the size of the laser fuse cannot be shrunk indefinitely. Thus, ablative laser-blown fuses become more difficult to implement due to the silicon space required to implement the fuses and avoid damage to neighboring circuits. Further, repairing an integrated circuit chip by open circuiting thousands of laser programmable fuses is a time consuming process.

An alternative fuse approach is to implement an electrically programmable fuse. One-time electrically programmable fuses, referred to as e-fuses, have become popular recently due to the circuit and system design flexibility which they provide. For example, an e-fuse can be programmed even after the integrated circuit chip has been packaged and installed in the system (unlike the laser fuse approach). For instance, a customer can tailor a circuit design to the specific needs of the application after the circuit is installed in the field. An e-fuse also provides freedom to alter a circuit design, or fix a problem that may occur during the life of the product. Electrically programmable fuses are much smaller than ablative-type fuses, resulting in circuit density advantages. Although electrically programmable e-fuses provide these noted benefits, integration with standard CMOS processing has been problematic. Furthermore, obtaining a tight distribution of open circuiting voltages derived using today's normal operating voltages continues to be challenging. Existing e-fuses today typically require voltages in excess of normal supply voltages for programming. As operating voltages continue to be aggressively scaled down with each succeeding generation of integrated circuit technology, obtaining sufficiently high voltages for programming an e-fuse can tax the electrical operating limits of the technology, and increase circuit complexity, for example, due to the need for charge pumps.

In view of this, there remains a need in the art for enhanced electrically programmable fuses, and methods of fabrication thereof, which may be readily programmed with today's on-chip operating voltages, and be readily integrated with standard semiconductor circuit fabrication processing.

SUMMARY OF THE INVENTION

Briefly summarized, the present invention comprises in one aspect a fuse for an integrated circuit. The fuse includes a first terminal portion and a second terminal portion interconnected by a fuse element. The first terminal portion and the second terminal portion reside over a first support and a second support, respectively, wherein the first support and the second support are spaced apart. The fuse element bridges the distance between the first terminal portion over the first support and the second terminal portion over the second support, with the fuse, first support and second support defining a π-shaped structure in elevational cross-section taken through the fuse element.

In further aspects, the first terminal portion, second terminal portion and fuse element are coplanar, and the fuse element resides over a void defined at least partially by the first support, the second support and the fuse element. A thermally insulating dielectric material, such as a planarizing glass, surrounds the fuse element and fills the void underneath the fuse element. In one embodiment, the fuse is a dog-boned shaped fuse in plan view, with the first terminal portion, second terminal portion and fuse element comprising silicide of a common thickness. The fuse is an electrically programmable fuse that is programmable at an operating voltage of the integrated circuit less than or equal to three volts.

In another aspect, a method of fabricating a fuse for an integrated circuit is provided. The method includes: forming a fuse above a support structure, the fuse comprising a first terminal portion, a second terminal portion and a fuse element connecting the first terminal portion and the second terminal portion; and etching the support structure to form a void underneath the fuse element interconnecting the first terminal portion and the second terminal portion, wherein the fuse, the etched support structure and the void therein define a π-shaped structure in elevational cross-section taken through the fuse element.

In yet another aspect, a method of fabricating a fuse for an integrated circuit is provided. The method includes: forming a polysilicon gate stack with a desired fuse shape in plan view; forming at least one gate sidewall spacer around the polysilicon gate stack in the desired fuse shape; siliciding exposed polysilicon of the polysilicon gate stack to form a fuse comprising a first terminal portion, a second terminal portion and a fuse element connecting the first terminal portion and the second terminal portion; removing the at least one sidewall spacer from the polysilicon gate stack, and isotropically etching the polysilicon to undercut the silicide and form a void underneath the fuse element, wherein the fuse and etched polysilicon gate stack define a π-shaped structure in elevational cross-section taken through the fuse element; and encapsulating the fuse and polysilicon gate stack in a thermally insulating dielectric material which fills the void underneath the fuse element and at least partially surrounds the fuse element.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5A is a top plan view of the structure of FIGS. 3A & 3B following formation of a gate dielectric and deposition of a gate conductor polysilicon, in accordance with a conventional integrated circuit fabrication approach;

FIG. 5B is a cross-sectional elevational view of the intermediate structure of FIG. 5A, taken along 5B-5B;

FIG. 6A is a top plan view of the intermediate structure of FIGS. 4A & 4B after formation of a "dog-bone" or "H" shaped gate dielectric and polysilicon conductor, again using similar processing steps as employed to construct the structure of FIGS. 5A & 5B, in accordance with an aspect of the present invention;

FIG. 6B is a cross-sectional elevational view of the structure of FIG. 6A, taken along line 6B-6B, in accordance with an aspect of the present invention;

BEST MODE FOR CARRYING OUT THE INVENTION

Typically, the resistance of programmed prior art polycide e-fuses is highly variable. Large variations in the electrical characteristics of the driver transistors due to threshold voltage (Vt) variations are commonly encountered. This results in variations in programming current, which in turn causes the length of the opened gap (electromigration length of the silicide) in the fuse element to vary. Since read current is traditionally forced through the silicon underlying the blown fuse element, the overall resistance of the programmed fuse will also vary. This dependence of the programmed resistance on the electromigration length of the silicide can lead to difficulties in correctly sensing the state of a programmed e-fuse.

In addition, recently developed e-fuse structures take advantage of electromigration (EM) effects to address certain of the above-noted problems of achieving scaling of programming voltage. The EM effect, caused by a positive divergence of the ionic flux, leads to an accumulation of vacancies, forming voids in the metal. Voids are formed inside of the metal conductors due to metal ion movement caused by momentum transfer from the electron flux at high current density. The void growth rate is a function of current density, and therefore, the site having the smallest cross-sectional area in an interconnect tends to form voids first. Thus, it is advantageous to somehow increase the local current density in the fuse element.

Figure 1:
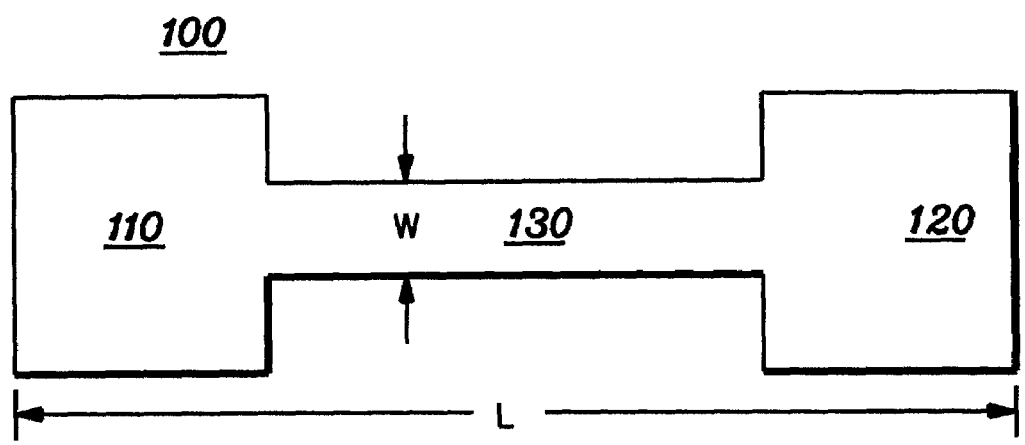
FIG. 1 is a plan view of one embodiment of a prior art two-dimensional "dog-bone" shaped electrically programmable fuse.

One approach to increasing local current density is depicted in FIG. 1, wherein the plan view layout of the illustrated electronic fuse 100 is a two-dimensional "dog-bone" shape. Fuse 100, which employs in-plane dimensional differences to locate an open circuit site via a localized high electron/current flow, includes a large cathode pad 110 and a large anode pad 120, between which a small cross-section interconnect 130 is disposed. This configuration has been adopted in the semiconductor industry as a basic e-fuse design. Although this e-fuse design alleviates some of the above-noted problems of scaling, size and programming energy requirements, there is still a need for further progress in these areas to meet requirements below the 65 nm technology level. By way of example, with current 65 nm back end of line (BEOL) technology, the electrically programmable fuse 100 illustrated in FIG. 1 might have an interconnect 130 width W greater than 90 nm, and an overall length L greater than 800 nm. Thus, programming efficiency of this fuse implementation is limited by width W, which depends on available lithography resolution, and technology extendibility is restricted by the overall length L of the fuse.

Generally stated, provided herein is an improved electrically programmable fuse structure, which reduces or eliminates variability of the e-fuse programming current by controlling the location of the open circuit point, and by controlling the length of the opened silicide region. This fuse structure also provides a much increased programmed/unprogrammed fuse resistance ratio, since the polysilicon region is removed from below the critical open circuit area (i.e., fuse element). Furthermore, the fuse structure presented herein provides reduced open circuit current requirements due to a reduced cross-sectional area and improved thermal insulation of the programmable fuse element region of the fuse structure. In one embodiment, the fuse presented herein has a first terminal portion, a second terminal portion and a fuse element, which interconnects the first terminal portion and the second terminal portion. The first terminal portion and the second terminal portion reside over a first support and a second support, respectively. The first support and the second support are spaced apart with the fuse element bridging the distance between the first terminal portion over the first support and the second terminal portion over the second support, wherein the fuse, first support and second support define a π-shaped structure in elevational cross-section taken through the fuse element.

By way of detailed example, described herein below is an electrically programmable fuse structure having a "dog-bone" or "H" shaped region of silicided polysilicon formed over an insulating (for example, shallow trench isolation (STI)) substrate. In one fabrication approach, there is a complete removal of the polysilicon from under the silicide layer in the narrow fuse element region by a maskless process. In the example described herein, silicided gate conductor polysilicon is employed. As such, the physical fuse element region comprises a layer of silicide, which can be from 10 nm to 50 nm in thickness. Thus, the narrow fuse element region is much thinner than the contact regions, and the thin narrow fuse region can be encapsulated in a CVD deposited glass, such as Boro PhosphoSilicate Glass (BPSG). Because of the significantly enhanced current density in the fuse element region, along with the excellent thermal insulation surrounding the fuse element region, the e-fuse structure described herein reliably opens in the predetermined narrow fuse element region. The absence of a parallel conductive path under the silicide results in nearly an open circuit in the programmed fuse, and assures that "healing" through underlying polysilicon cannot occur.

Figure 2A:
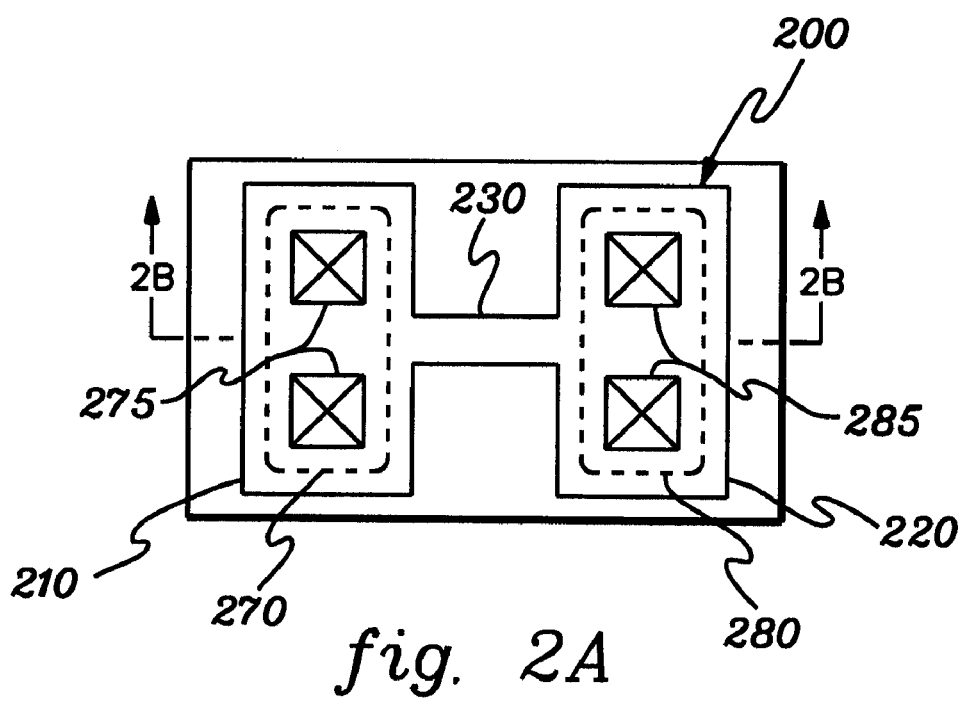
FIG. 2A is a top plan view of one embodiment of an electrically programmable fuse structure, in accordance with an aspect of the present invention.
Figure 2B:
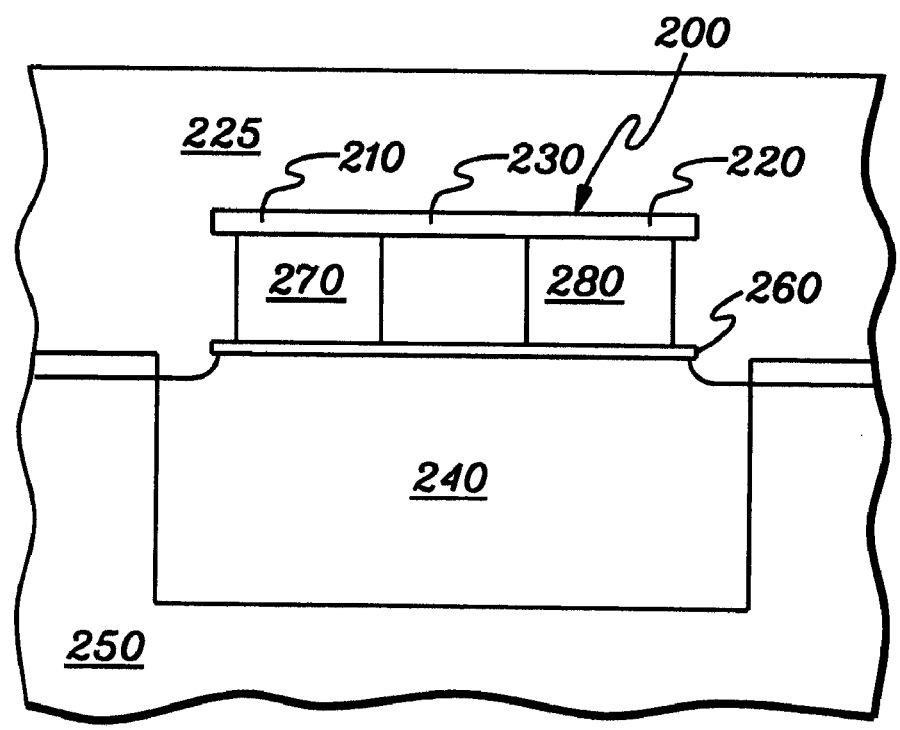
FIG. 2B is a cross-sectional elevational view of the electrically programmable fuse structure of FIG. 2A, taken along line 2B-2B, in accordance with an aspect of the present invention.

FIGS. 2A & 2B depict one embodiment of an electrically programmable fuse structure, generally denoted 200, in accordance with an aspect of the present invention. As shown in FIG. 2A, fuse 200 again has a dog-bone shaped planar configuration wherein a first terminal portion 210 is connected to a second terminal portion 220 by a fuse element 230. The fuse structure 200 is formed above an insulating substrate 240, such as a shallow trench isolation region in a silicon wafer 250 (see FIG. 2B). An insulator 260, such as a gate oxide separates isolation region 240 from a first support 270 and a second support 280. Supports 270 & 280 are, in one embodiment, gate polysilicon pillars, at least partially formed commensurate with formation of gate stacks for the integrated circuit device regions of the wafer (discussed further below). Further, by way of example, fuse structure 200 is a silicide, which is surrounded by a thermally insulating dielectric material 225 such as BPSG or other planarizing glass. Contacts 275 and 285 can be made from above the electrically programmable fuse 200 to the first terminal portion and second terminal portion, respectively. For reliability, the contacts are made in a region of the terminal portions disposed over the first and second supports 270, 280.

Figure 4A:
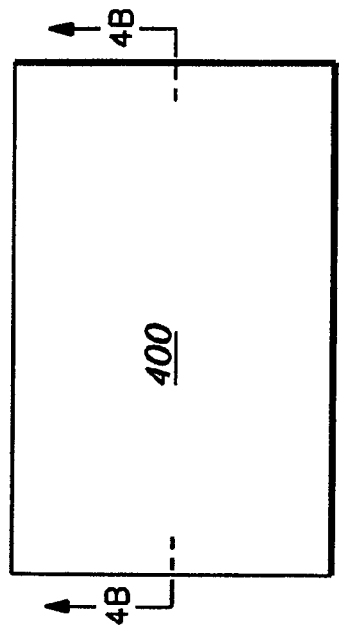
FIG. 4A is a top plan view of an intermediate structure obtained during a fuse fabrication approach, using similar processing steps as employed to construct the immediate structure of FIGS. 3A & 3B, in accordance with an aspect of the present invention.
Figure 4B:
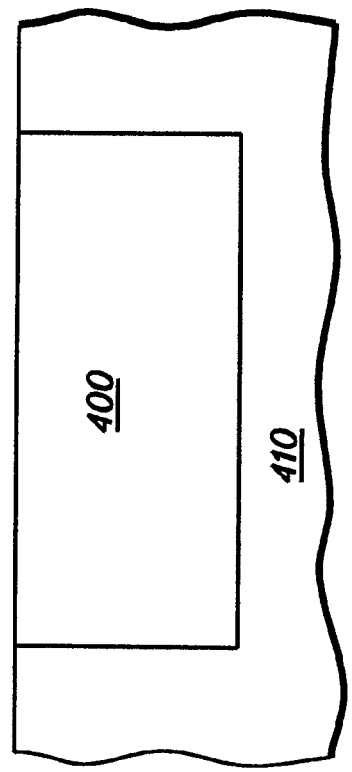
FIG. 4B is a cross-sectional elevational view of the structure of FIG. 4A, taken along line 4B-4B, in accordance with an aspect of the present invention.
Figure 3A:
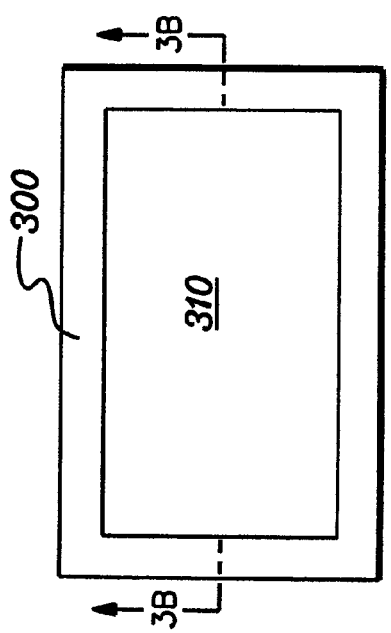
FIG. 3A is a top plan view of one embodiment of a conventional intermediate structure obtained in accordance with a typical integrated circuit fabrication approach.
Figure 3B:
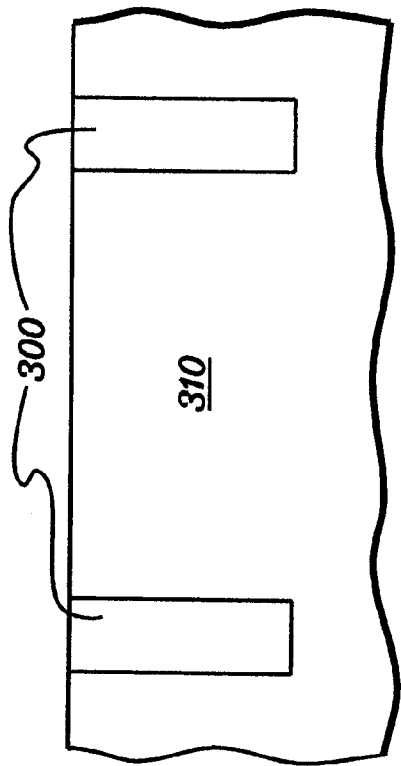
FIG. 3B is a cross-sectional elevational view of the structure of FIG. 3A, taken along line 3B-3B.

FIGS. 3A & 3B depict conventional processing employed to define an insulated region 300 in a substrate 310, such as a silicon substrate. In the embodiment illustrated, region 300 is a rectangular shaped, walled STI region within which one or more electronic devices are to be fabricated using conventional processing. FIGS. 4A & 4B depict one embodiment of how the processing of FIGS. 3A & 3B can be adapted for use with the present invention. In these figures, a solid rectangular STI region 400 is defined in a substrate 410, such as a silicon wafer. This region 400 is an insulating region above which the electrically programmable fuse structure is to be fabricated, in accordance with aspects of the present invention.

Those skilled in the art should note that the processing described herein is provided by way of example only. The electrically programmable fuse structure and fabrication process is applicable to other substrates such as silicon on insulator (SOI), as well as non-semiconductor substrates. FIGS. 3A, 3B, 5A, 5B, 7A & 7B depict a conventional process flow for fabrication of a device region containing a standard semiconductor device, such as CMOS transistor, while FIGS. 4A, 4B, 6A, 6B, 8A & 8B depict formation of a fuse structure employing various similar processing steps as used for formation of the device region. Thus, the fuse fabrication method described herein readily integrates with conventional device fabrication processings.

Following standard well implants, a gate dielectric 510 (such as gate oxide) is formed, and a gate conductor polysilicon 500 is deposited and patterned, as shown in FIGS. 5A & 5B.

The analogous processing steps can be employed for the fuse fabrication processing of FIGS. 6A & 6B. Specifically, a dog-bone shaped dielectric 610 (above isolation region 400) and polysilicon region 600 can be formed by deposition and patterning. As shown in this figure, since the same processing steps are employed (only with different patterning) the height of the polysilicon over isolation region 400 in FIG. 6B can be the same as the height of the gate stack 500 in the device region illustrated in FIG. 5B.

Figure 7A:
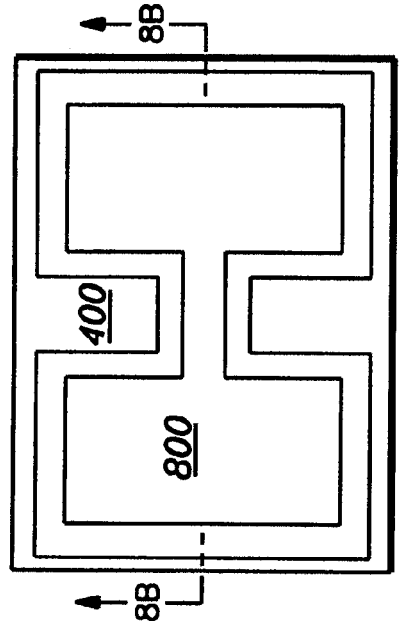
FIG. 7A is a top plan view of the structure of FIGS. 5A & 5B after standard gate sidewall spacers have been formed, halos, extensions and heavily doped source-drain regions are implanted, and silicide has been formed in accordance with a conventional integrated circuit fabrication approach.
Figure 7B:
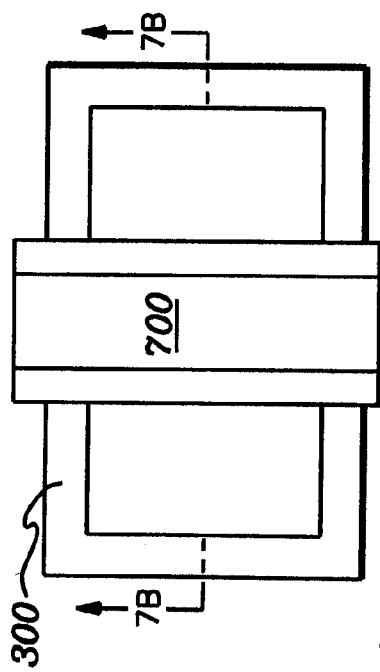
FIG. 7B is a cross-sectional view of the structure of FIG. 7A, taken along line 7B-7B.

As illustrated in FIGS. 7A & 7B, standard gate sidewall spacers, including oxide sidewall spacer 710 and nitride sidewall spacer 720 are formed. Additionally, halos, extensions and heavily doped source-drained regions are implanted. A layer of metal is then conformly deposited, for example, by chemical vapor deposition (CVD) over the device region. The metal may comprise one of nickel, cobalt, tungsten, titanium, tantalum, or other metal capable of reacting with silicon to form a low resistivity thermally stable silicide. The substrate is annealed to react the metal with the silicon to form a silicide layer 700. Metal in contact with insulating materials, such as STI region 300 and sidewall spacers 710, 720 does not react, and is subsequently removed with a selective etch leaving the silicided regions 700 shown in FIGS. 7A & 7B.

Figure 8A:
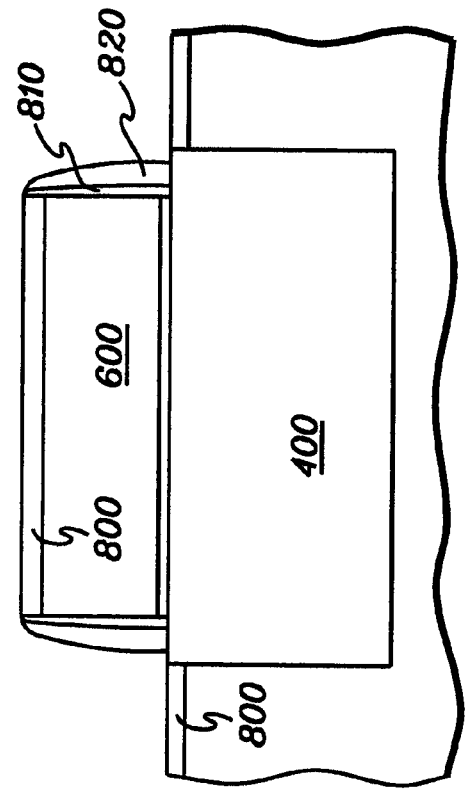
FIG. 8A is top plan view of the intermediate structure of FIGS. 6A & 6B after gate sidewall spacers have been formed surrounding the dog-bone shaped polysilicon material and a silicide layer has been defined in exposed silicon and polysilicon, using similar processing steps as employed to construct the intermediate structure of FIGS. 7A and 7B, in accordance with an aspect of the present invention.
Figure 8B:
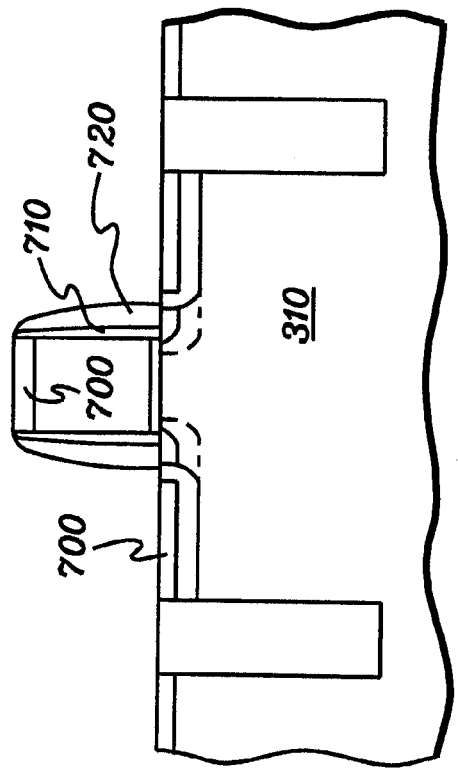
FIG. 8B is a cross-sectional elevational view of the structure of FIG. 8A, taken along line 8B-8B, in accordance with an aspect of the present invention.

FIGS. 8A & 8B depict analogous processing steps for formation of the fuse structure in accordance with the present invention. That is, an oxide sidewall spacer 810 and a nitride sidewall spacer 820 are formed surrounding the dog-bone shaped polysilicon structure 600. This is followed by conformal deposition of a metal, again (for example) by CVD, and the subsequent annealing of the substrate to react the metal with the silicon and polysilicon to form a silicide layer 800. The depth of silicide layer 800 may be the same as the depth of silicide layer 700 in the device region of the wafer, since the two silicides may be formed at the same time. Again, the metal employed in formation of the silicide may be nickel, cobalt, tungsten, titanium, tantalum or any other metal capable of reacting with silicon/polysilicon to form a low resistivity thermally stable silicide.

Figure 10A:
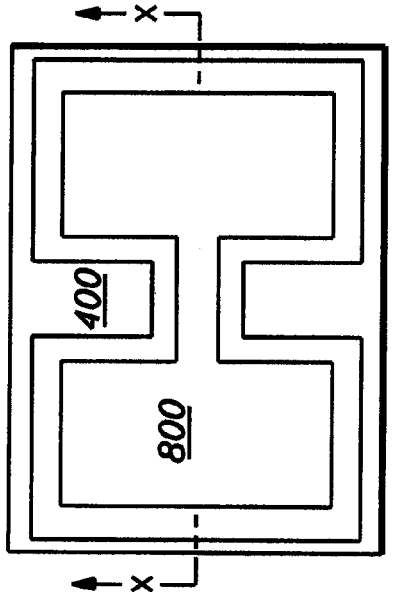
FIG. 10A is a top plan view of the intermediate structure of FIGS. 8A & 8B showing that the fuse structure region remains unmasked, in accordance with an aspect of the present invention.
Figure 10B:
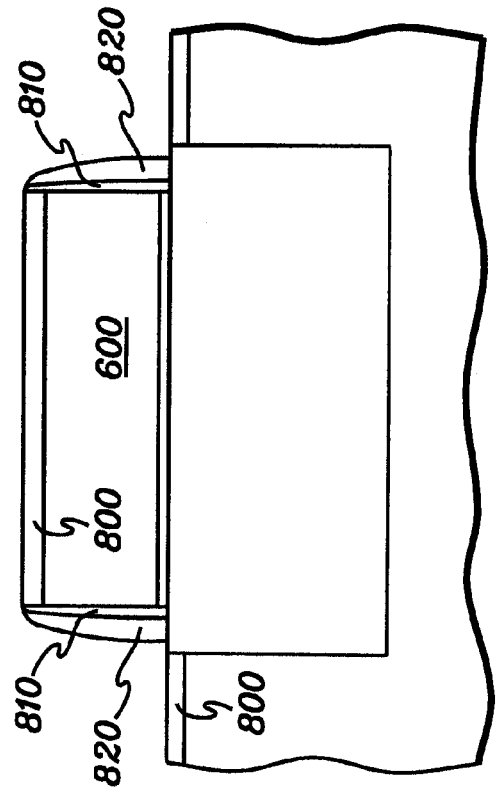
FIG. 10B is a cross-sectional elevational view of the intermediate structure of FIG. 10A, taken along line X-X, in accordance with an aspect of the present invention.
Figure 9A:
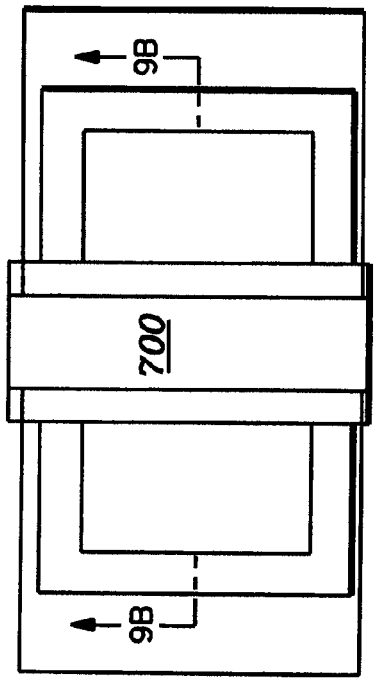
FIG. 9A is a top plan view of the structure of FIGS. 7A & 7B after a layer of photoresist is applied and patterned as a block mask covering the integrated circuit device region, in accordance with an aspect of the present invention.
Figure 9B:
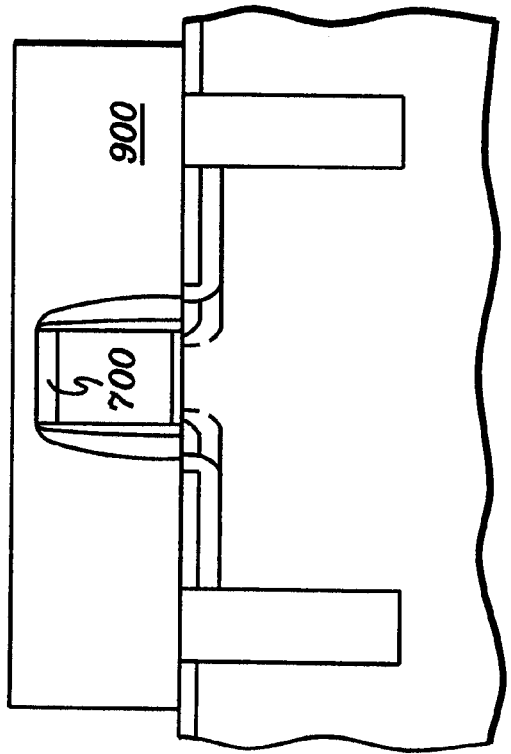
FIG. 9B is a cross-sectional elevational view of the structure of FIG. 9A, taken along line 9B-9B, in accordance with an aspect of the present invention.

FIGS. 9A & 9B depict the device region structure of FIGS. 7A & 7B after a layer of photoresist is applied and patterned as a block mask 900 so that the device region, including silicide 700, remains protected by the resist. This photoresist is patterned so that the fuse region (e.g., depicted in FIGS. 10A and 10B) remains open, with the silicide layer 800 over polysilicon 600 exposed, along with sidewall spacers 810, 820. The photoresist mask employed in the device region and illustrated in FIGS. 9A & 9B is used to protect the device region during subsequent processing of the fuse structure in the fuse region. This blocking mask is a non-critical mask, and may be relatively inexpensive.

Figure 10C:
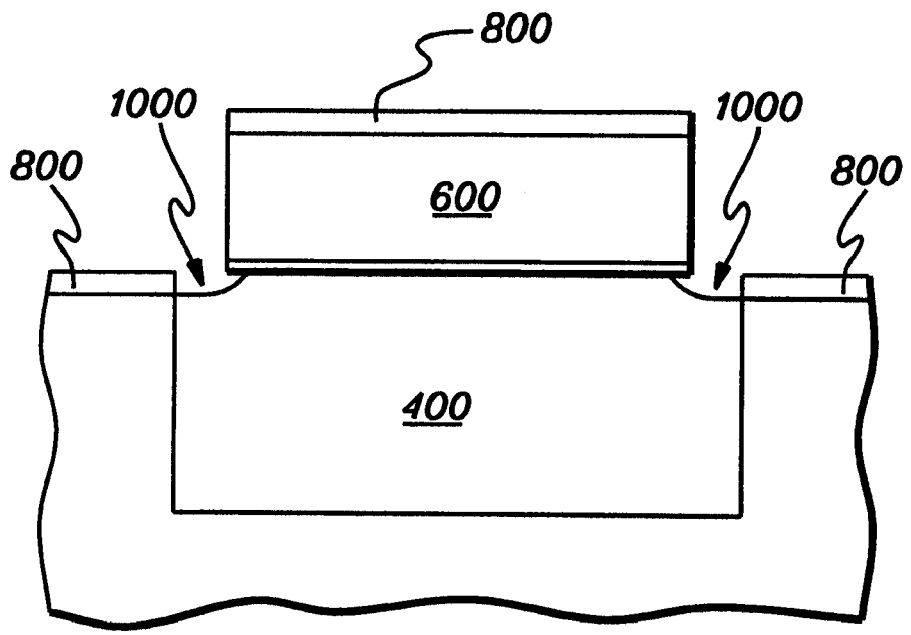
FIG. 10C is a cross-sectional elevational view of the structure of FIGS. 10A & 10B, taken along line X-X of FIG. 10A, and illustrating the structure after isotropic etches have been employed to remove the sidewall spacers from the polysilicon material in the fuse structure region, in accordance with an aspect of the present invention.
Figure 10D:
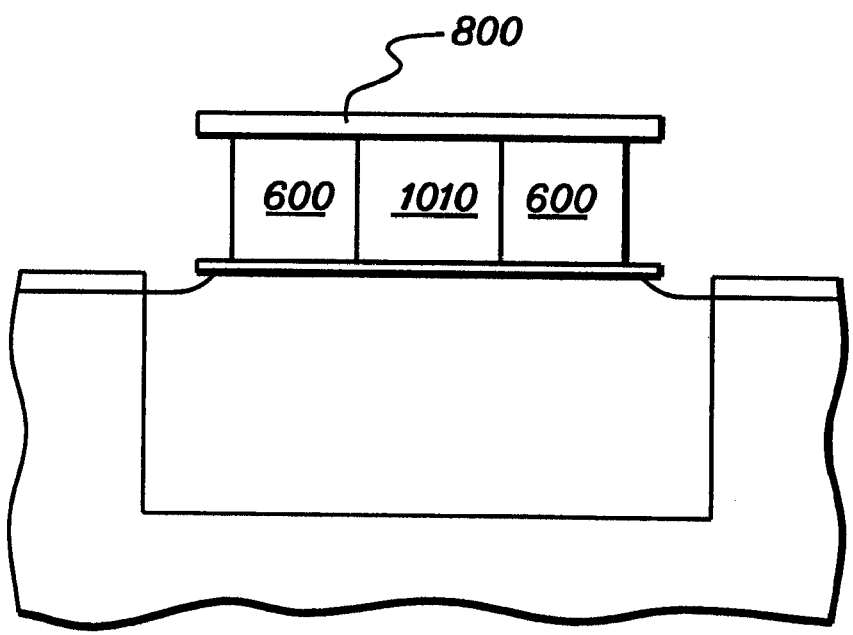
FIG. 10D is a cross-sectional elevational view of the intermediate structure of FIG. 10C, taken along line X-X of FIG. 10A, and illustrating the structure after an isotropic silicon etch has been employed to undercut the polysilicon supporting the silicide layer, with the etch continuing until the polysilicon is etched out from the region below the fuse element, in accordance with an aspect of the present invention.

With the resist block mask in place over the device region, isotropic etching is used to remove sidewall spacers 810, 820 (see FIG. 10B) from the polysilicon 600 in the fuse region. Divots 1000 (see FIG. 10C) that may form in STI 400 are of no concern, since they result from the short oxide etch required to remove the thin oxide spacer. As shown in FIG. 10C, silicide 800 remains exposed, as well as the sidewalls of polysilicon 600. With the block mask 900 (see FIG. 9B) still in place in the device region, an isotropic silicon etch is then used to undercut silicide layer 800 as shown in FIG. 10D. This etch continues until the polysilicon is completely etched out from directly below the fuse element region, forming void 1010 underneath the fuse element region. In one embodiment, the fuse element may be a minimum photolithographic feature size or less. The width of the fuse element may be narrowed by application of appropriate etch bias during polysilicon patterning, or by use of sidewall image transfer techniques. Since the terminal portions (i.e., fuse contact regions) are designed to be much wider than the fuse element, the silicide in the contact regions remain well supported by polysilicon 600. Only a relative narrow border is etched out, resulting in the undercutting of the silicide as illustrated in FIG. 10D.

Figure 11A:
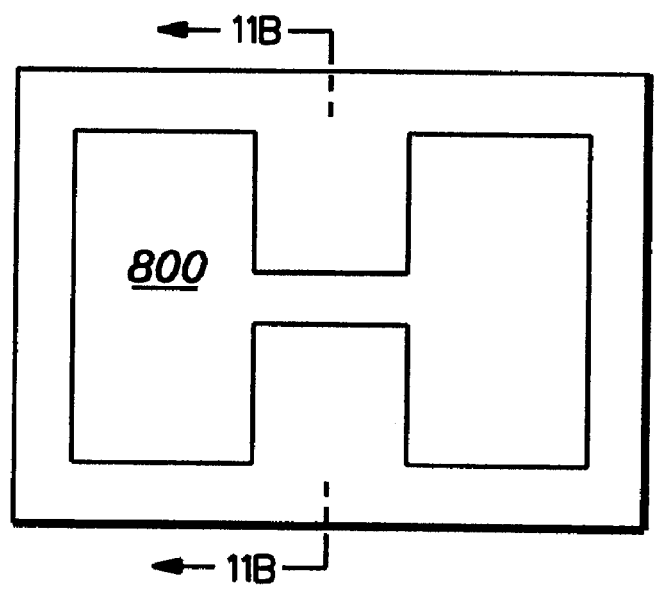
FIG. 11A is a top plan view of the intermediate structure of FIG. 10D, in accordance with an aspect of the present invention.
Figure 11B:
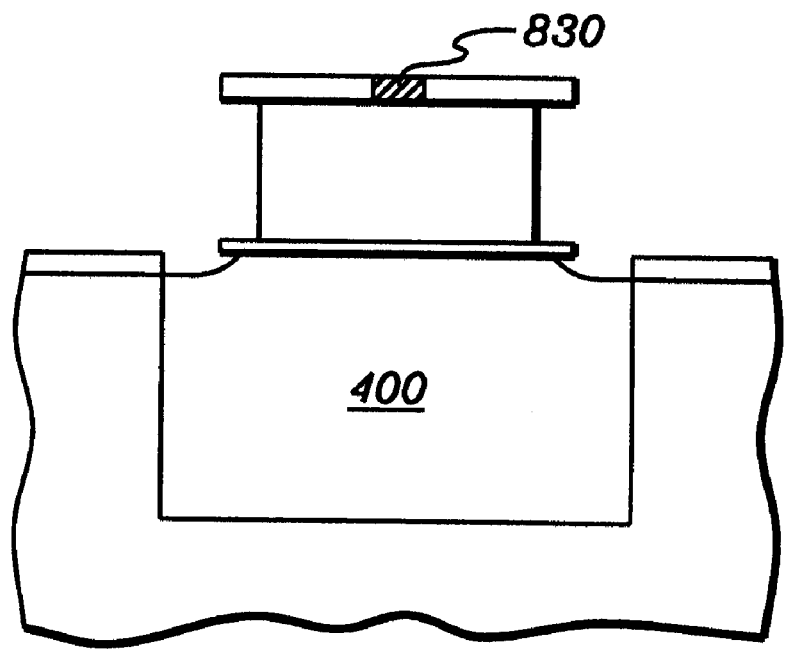
FIG. 11B is a cross-sectional elevational view of the intermediate structure of FIG. 11A, taken along line 11B-11B, in accordance with an aspect of the present invention.

FIGS. 11A & 11B depict the structure of FIG. 10D, wherein FIG. 11B is a cross-section of the plan view of the intermediate structure of FIG. 11A, taken along line 11B-11B. In FIG. 11B, a cross section taken transverse the elongate fuse element 830.

Figure 12:
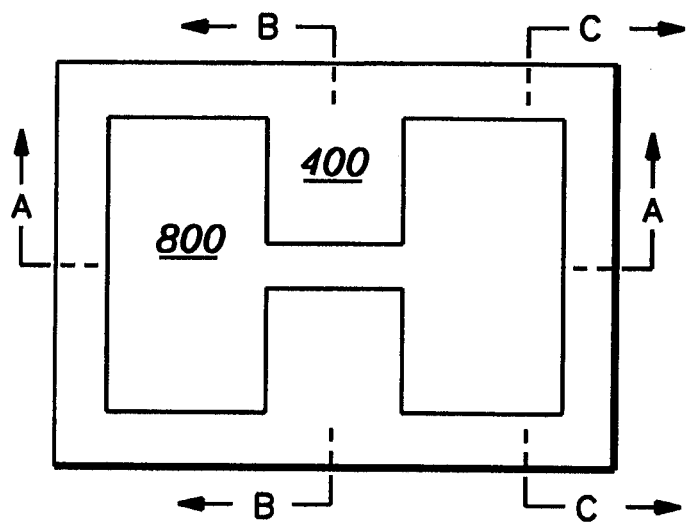
FIG. 12 is a top plan view of one embodiment of a completed fuse structure after provision of a thermally insulating dielectric material surrounding the intermediate structure of FIGS. 11A & 11B, in accordance with an aspect of the present invention.
Figure 12A:
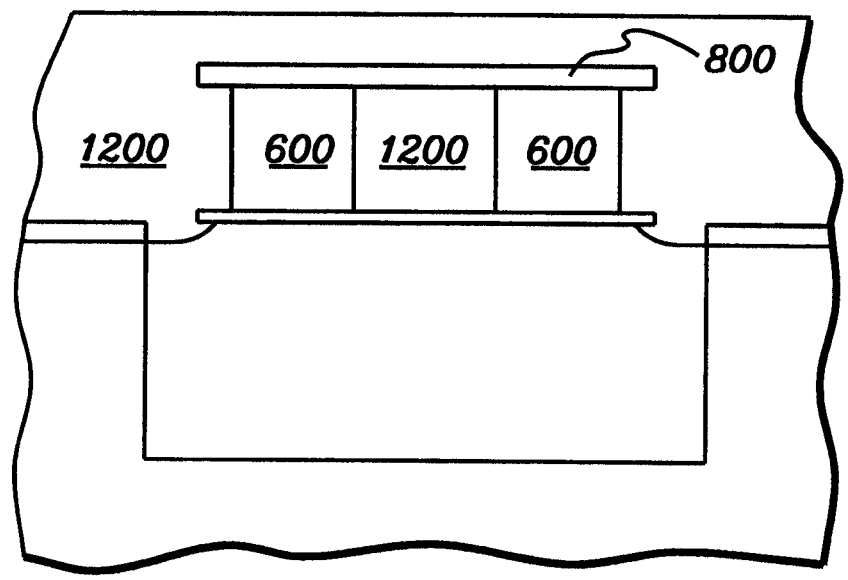
FIG. 12A is a cross-sectional elevational view of the fuse structure of FIG. 12, taken along line A-A, in accordance with an aspect of the present invention.
Figure 12B:
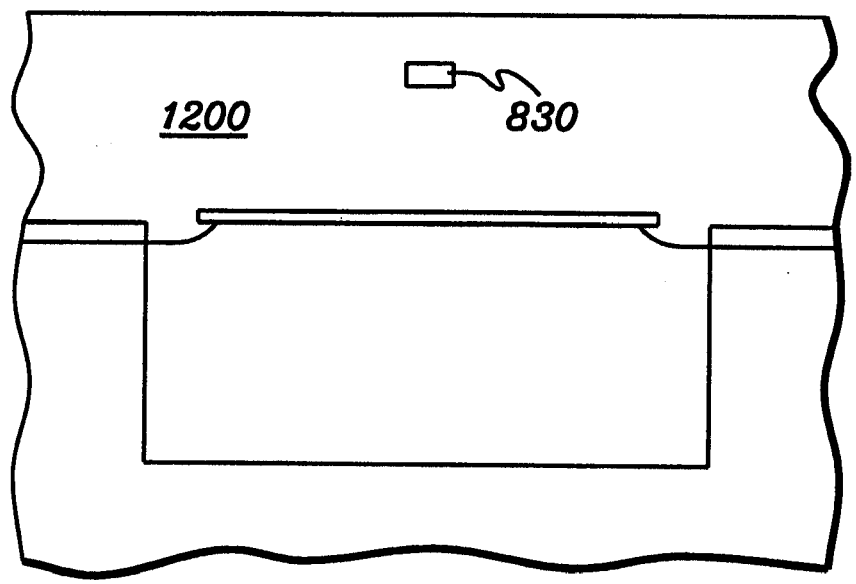
FIG. 12B is a cross-sectional elevational view of the fuse structure of FIG. 12, taken along line B-B, in accordance with an aspect of the present invention.
Figure 12C:
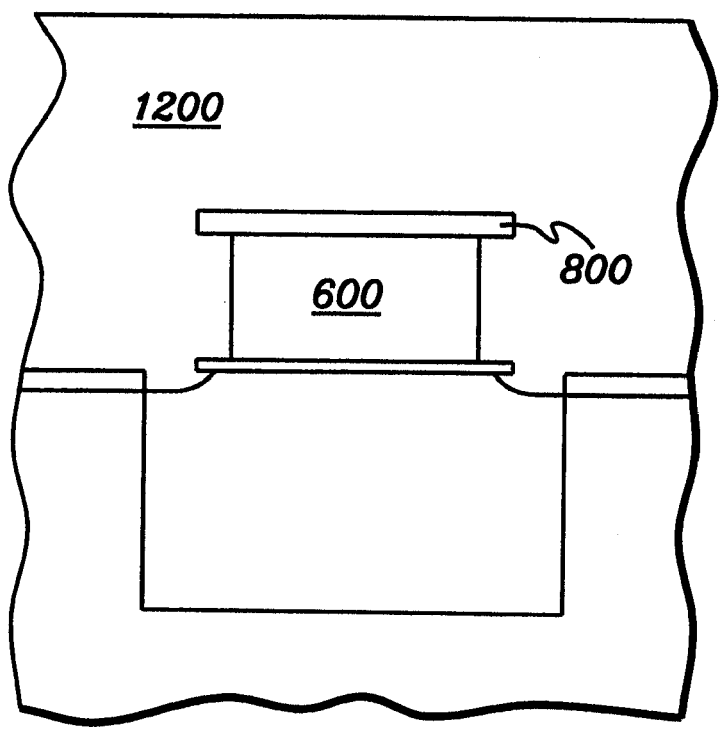
FIG. 12C is a cross-sectional elevational view of the fuse structure of FIG. 12, taken along line C-C, in accordance with an aspect of the present invention.

As a next processing step, the masking photoresist 900 (see FIG. 9B) is stripped out of the device regions and soft CVD oxide, such as BPSG, is deposited. The CVD oxide process is a gentle process that does not compromise the mechanical integrity of the fuse element. This dielectric encapsulates the fuse element, providing additional mechanical support and thermal insulation. FIGS. 12A, 12B & 12C are cross-sectional elevational views of the fuse structure of FIG. 12, taken along lines A-A, B-B & C-C, respectively. As shown, fuse 800 is supported by first and second polysilicon supports and the thermally insulating dielectric material 1200 substantially surrounds the fuse element 830 portion of fuse 800.

Standard wafer processing then resumes, with formation of contact via metallurgy, BEOL wiring, interlevel dielectrics and interconnects.

Those skilled in the art will note from the above description, that the fuse structure presented herein advantageously has a controllable geometry without depending on mask alignment processing. Thus, the fuse structure and method of fabrication result in excellent reproducibility of the open-fuse characteristics. Additionally, the top surface of the fuse element in the fuse structure presented is coplanar with the upper surfaces of the terminal portions containing the contact regions. The silicide fuse element bridges straight across polysilicon pillars. In the structure presented, the highest current density consistently occurs within the thin silicide fuse element bridging the terminal portions.

As a further enhancement, after undercutting the silicide to form the void beneath the fuse element (see FIGS. 10D, 11A & 11B), a conformal layer of CVD compressive nitride could be deposited to induce a tensile stress in the fuse element, which can accelerate programming of the fuse. A conformal compressive nitride layer on the fuse element can be formed by first stripping photoresist blocking mask 900 (see FIG. 9B), and then conformally depositing the compressive nitride layer. A second blocking mask (e.g., photoresist) may then be optionally used to protect the fuse region. The second blocking mask is patterned such that it is opened in selected device regions to expose the deposited compressive nitride layer. The exposed compressive nitride layer in the selected device regions is then removed by etching. Finally, the second blocking mask photoresist is stripped and standard processing continues. Application of a compressive nitride film has several advantages. For example, the thermal resistance between the fuse element and the underlying substrate is increased, making electromigration easier, and the compressive nitride film will act to mechanically separate the fuse element as the element is heated during programming, thus requiring less electrochemical energy during programming.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A fuse for an integrated circuit, the fuse comprising:

a first terminal portion and a second terminal portion interconnected by a fuse element, and wherein the first terminal portion and the second terminal portion reside over a first support and a second support, respectively, the first support and the second support being spaced apart, and wherein the fuse element bridges a distance between the first terminal portion over the first support and the second terminal portion over the second support, with the fuse, the first support and the second support defining a π-shaped structure in elevational cross-section through the fuse element; and wherein the first terminal portion, the second terminal portion and the fuse element are coplanar, and the fuse resides entirely over an isolation region in a semiconductor substrate, and wherein the first terminal portion and the second terminal portion are electrically contacted for programming of the fuse from above only.

2. The fuse of claim 1, wherein the fuse element resides above a void defined at least partially by the first support, the second support and the fuse element, the void being an absence of any material directly underneath the fuse element.

3. The fuse of claim 1, wherein a thermally insulating dielectric material surrounds the fuse element, including underneath the fuse element.

4. The fuse of claim 1, wherein the fuse is a dog-bone shaped fuse in plan view, with the first terminal portion, the second terminal portion and the fuse element having a common thickness.

5. The fuse of claim 1, wherein the first support comprises polysilicon in physical contact with the first terminal portion, and wherein the second support comprises polysilicon in physical contact with the second terminal portion, and wherein the first terminal portion, the second terminal portion and the fuse element comprise silicide.

6. The fuse of claim 5, wherein an integrated circuit includes at least one transistor with a gate stack, and wherein a height of the first support and the first terminal portion together is equal to a height of the second support and the second terminal portion together, and is equal to a height of the gate stack.

7. The fuse of claim 1, wherein the fuse is an electrically programmable fuse that is programmable at an operating voltage of the integrated circuit less than or equal to three volts.

* * * * *